United States Patent
DeCusatis et al.

(10) Patent No.: US 7,061,944 B2
(45) Date of Patent: *Jun. 13, 2006

(54) APPARATUS AND METHOD FOR WAVELENGTH-LOCKED LOOPS FOR SYSTEMS AND APPLICATIONS EMPLOYING ELECTROMAGNETIC SIGNALS

(75) Inventors: Casimer M. DeCusatis, Poughkeepsie, NY (US); Lawrence Jacobowitz, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 380 days.

This patent is subject to a terminal disclaimer.

(21) Appl. No.: 09/865,256

(22) Filed: May 25, 2001

(65) Prior Publication Data

US 2002/0176457 A1 Nov. 28, 2002

(51) Int. Cl.
*H01S 3/098* (2006.01)

(52) U.S. Cl. .............................. 372/18; 372/20; 372/38; 372/25; 372/26

(58) Field of Classification Search .................. 372/18, 372/20; 256/350; 250/214; 359/245
See application file for complete search history.

(56) References Cited

U.S. PATENT DOCUMENTS

| 3,777,154 | A |   | 12/1973 | Lindsey |         |
|-----------|---|---|---------|---------|---------|
| 3,943,021 | A |   | 3/1976  | Lindsey |         |
| 4,588,296 | A | * | 5/1986  | Cahill et al. | 256/350 |
| 4,725,120 | A |   | 2/1988  | Parzygnat |       |

(Continued)

FOREIGN PATENT DOCUMENTS

| EP | 0 486 208 A2 | 5/1992 |
| EP | 0 571 037 A1 | 11/1993 |

(Continued)

OTHER PUBLICATIONS

"Introduction to DWDM Technology Data in a Rainbow", by Stamatios V. Kartalopoulos, Lucent Technologies, IEEE Communications Society, Sponsor, SPIE Optical Engineering Press, pp. 65–68.

(Continued)

*Primary Examiner*—Minsun Oh Harvey
*Assistant Examiner*—Dung Nguyen
(74) *Attorney, Agent, or Firm*—Scully, Scott, Murphy & Presser; Lisa U. Jaklitsch, Esq.

(57) ABSTRACT

A wavelength-locked loop servo-control circuit and methodology that enables real time mutual alignment of an electromagnetic signal having a peaked spectrum function including a center wavelength and a wavelength selective device implementing a peaked passband function including a center wavelength, in a system employing electromagnetic waves. The circuit comprises a mechanism for applying a dither modulation signal at a dither modulation frequency to the electromagnetic signal, and inputting the dither modulated electromagnetic signal to the wavelength selective device; a mechanism for converting a portion of the dither modulated electromagnetic signal to an electric feedback signal; a mechanism for continuously comparing the feedback signal with said dither modulation signal and generating an error signal representing a difference between a frequency characteristic of the feedback signal and a dither modulation frequency; and a mechanism for adjusting the peaked spectrum function of the electromagnetic signal according to the error signal. The center wavelength of the electromagnetic signal and the wavelength selective device center wavelength become aligned when the frequency characteristic of the feedback signal is two times the dither modulation frequency.

48 Claims, 8 Drawing Sheets

U.S. PATENT DOCUMENTS

| | | | |
|---|---|---|---|
| 4,744,617 A | 5/1988 | Hvezda et al. | |
| 4,863,332 A | 9/1989 | Wiholm et al. | |
| 4,870,637 A | 9/1989 | Follett et al. | |
| 4,872,739 A | 10/1989 | Kahn et al. | |
| 4,890,894 A | 1/1990 | Kwa | |
| 4,892,376 A | 1/1990 | Whitehouse | |
| 4,895,424 A | 1/1990 | Hughes | |
| 4,943,136 A | 7/1990 | Popoff | |
| 4,944,568 A | 7/1990 | Danbach et al. | |
| 5,009,477 A | 4/1991 | Alferness et al. | |
| 5,068,864 A | 11/1991 | Javan | |
| 5,071,216 A | 12/1991 | Sullivan | |
| 5,101,460 A | 3/1992 | Richard | |
| 5,134,508 A | 7/1992 | Corda | |
| 5,144,691 A | 9/1992 | August et al. | |
| 5,155,784 A | 10/1992 | Knott | |
| 5,155,785 A | 10/1992 | Holland et al. | |
| 5,182,780 A | 1/1993 | Robertson | |
| 5,204,925 A | 4/1993 | Bonanni et al. | |
| 5,218,654 A | 6/1993 | Sauter | |
| 5,228,105 A | 7/1993 | Glista | |
| 5,240,617 A | 8/1993 | Hopf | |
| 5,245,680 A | 9/1993 | Sauter | |
| 5,247,593 A | 9/1993 | Lin et al. | |
| 5,259,051 A | 11/1993 | Burack et al. | |
| 5,268,981 A | 12/1993 | Shahid | |
| 5,280,551 A | 1/1994 | Bowen | |
| 5,283,851 A | 2/1994 | Vergnolle | |
| 5,340,980 A * | 8/1994 | Bianchini et al. | 250/214 |
| 5,367,598 A | 11/1994 | Devenish, III et al. | |
| 5,371,820 A | 12/1994 | Welbourn et al. | |
| 5,388,174 A | 2/1995 | Roll et al. | |
| 5,402,515 A | 3/1995 | Vidacovich et al. | |
| 5,543,935 A | 8/1996 | Harrington | |
| 6,222,861 B1 * | 4/2001 | Kuo et al. | 372/20 |
| 6,317,247 B1 * | 11/2001 | Yang et al. | 359/245 |
| 6,333,941 B1 * | 12/2001 | Hung | 372/20 |

FOREIGN PATENT DOCUMENTS

| | | |
|---|---|---|
| EP | 0 840 468 A3 | 5/1998 |
| EP | 0 911 658 A1 | 4/1999 |
| JP | 6-19838 | 1/1994 |
| JP | 07-170232 | 7/1995 |
| JP | 10-190106 | 12/1998 |
| JP | 10-336154 | 12/1998 |
| WO | WO 94/18587 | 8/1994 |
| WO | WO 94/18589 | 8/1994 |
| WO | WO 96/08083 | 3/1996 |
| WO | WO 96/10201 | 4/1996 |
| WO | WO 99/43060 | 8/1999 |

OTHER PUBLICATIONS

"Introduction to DWDM Technology Data in a Rainbow", by Stamatios V. Kartalopoulos, Chapter 9, pp. 131–136.

"Distributed feedback semiconductor lasers", by John Carroll, et al., IEE Circuits, Devices and Systems Series 10, SPIE Press Monograph vol. PM52, 1998, pp. 7–15.

IEEE Communications, SPIE Optical Engineering Press, Stamatios V. Kartalopoulos, "Introduction to DWDM Technology: Data in a Rainbow", pp. 67 and 68.

The Institution of Electrical Engineers, IEE Circuits, Devices and Systems Series 10, John Carroll, James Whiteaway, & Dick Plumb, "Distributed Feedback Semiconductor Lasers", pp. 9–15.

Chapter 9, "Other Optical Components", pp. 131–137.

"An Introduction to Pound–Drever–Hall Laser Frequency Stabilization", Eric D. Black, LIGO Project, California Institute of Technology, LIGO–P990042–00–D, pp. 1–36.

* cited by examiner

APPARATUS AND METHOD FOR WAVELENGTH-LOCKED LOOPS FOR SYSTEMS AND APPLICATIONS EMPLOYING ELECTROMAGNETIC SIGNALS

BACKGROUND OF THE INVENTION

1. Field of the Invention

The present invention relates generally to systems that generate and process electromagnetic signals in the radio frequency, microwave and optical frequency spectra, and particularly to a novel servo-control circuit for such systems employing such electromagnetic signals that teaches the principle of wavelength-locked loops for optimizing signal power and transmission bandwidth through such systems.

2. Description of the Prior Art

Wavelength Division Multiplexing (WDM) and Dense Wavelength Division Multiplexing (DWDM) are light-wave application technologies that enable multiple wavelengths (colors of light) to be paralleled into the same optical fiber with each wavelength potentially assigned its own data diagnostics. Currently, WDM and DWDM products combine many different data links over a single pair of optical fibers by remodulating the data onto a set of lasers, which are tuned to a very specific wavelength (within 0.8 nm tolerance, following industry standards). On current products, up to 32 wavelengths of light can be combined over a single fiber link with more wavelengths contemplated for future applications. The wavelengths are combined by passing light through a series of thin film interference filters, which consist of multi-layer coatings on a glass substrate, pigtailed with optical fibers. The filters combine multiple wavelengths into a single fiber path, and also separate them again at the far end of the multiplexed link. Filters may also be used at intermediate points to add or drop wavelength channels from the optical network.

Ideally, a WDM laser would produce a very narrow linewidth spectrum consisting of only a single wavelength, and an ideal filter would have a square bandpass characteristic of about 0.4 nm width, for example, in the frequency domain. In practice, however, every laser has a finite spectral width, which is a Gaussian spread about 1 to 3 nm wide, for example, and all real filters have a Gaussian bandpass function. It is therefore desirable to align the laser center wavelength with the center of the filter passband to facilitate the reduction of crosstalk between wavelengths, since the spacing between WDM wavelengths are so narrow. In commercial systems used today, however, it is very difficult to perform this alignment—lasers and filters are made by different companies, and it is both difficult and expensive to craft precision tuned optical components. As a result, the systems in use today are far from optimal; optical losses in a WDM filter can be as high as 4 db due to misalignment with the laser center wavelength (the laser's optical power is lost if it cannot pass through the filter). This has a serious impact on optical link budgets and supported distances, especially since many filters must be cascaded together in series (up to 8 filters in current designs, possibly more in the future). If every filter was operating at its worst case condition (worst loss), it would not be possible to build a practical system. Furthermore, the laser center wavelengths drift with voltage, temperature, and aging over their lifetime, and the filter characteristics may also change with temperature and age. The laser center wavelength and filter bandwidth may also be polarization dependent. This problem places a fundamental limit on the design of future WDM networking systems.

A second, related problem results from the fact that direct current modulation of data onto a semiconductor laser diode causes two effects, which may induce rapid shifts in the center wavelength of the laser immediately after the onset of the laser pulse. These are (1) frequency chirp and (2) relaxation oscillations. Both effects are more pronounced at higher laser output powers and drive voltages, or at higher modulation bit rates. Not only can these effects cause laser center wavelengths to change rapidly and unpredictably, they also cause a broadening of the laser linewidth, which can be a source of loss when interacting with optical filters or may cause optical crosstalk. Avoiding these two effects requires either non-standard, expensive lasers, external modulators (which are lossy and add cost), or driving the laser at less than its maximum power capacity (which reduces the link budget and distance). Lowering the data modulation rate may also help, but is often not an option in multi-gigabit laser links.

It would thus be highly desirable to provide a new method for providing stable, optimal alignment between a laser center wavelength and the center of a Gaussian bandpass filter in order to optimize power transmission through such fiber optic systems and reduce optical crosstalk interference in optical networks.

SUMMARY OF THE INVENTION

It is an object of the present invention to provide a servo-control "wavelength-locked loop" circuit that enables real time mutual alignment of an electromagnetic signal having a peaked spectrum function including a center wavelength and a wavelength selective device implementing a peaked passband function including a center wavelength, in a system employing electromagnetic waves.

It is another object of the present invention to provide a servo-control system and methodology for WDM and DWDM systems and applications that is designed to optimize power through multi-gigabit laser/optic systems.

It is a further object of the present invention to provide a wavelength-locked loop for an optical system that enables real time alignment and tracking of any spectral device that selects a wavelength, such as a Bragg grating, in optical fibers and waveguides, etc., for use in WDM systems.

It is yet another object of the present invention to provide a servo/feedback loop for an optical system, referred to as a "wavelength-locked loop," that enables real time alignment of variable optical attenuators by offsetting an optical filter from a known transmission in optical fibers and waveguides, etc.

It is yet a further object of the present invention to provide a servo/feedback loop for an optical system, referred to as a "wavelength-locked loop," that may be used in light polarization applications.

It is still another object of the present invention to provide a servo/feedback loop for an optical system, referred to as a "wavelength-locked loop," that enables real time alignment and tracking of laser center wavelengths and filter passband center wavelengths in multi-gigabit laser/optical systems such that the optical loss of a WDM filter/laser combination is greatly reduced, thereby enabling significantly larger link budgets and longer supported distances.

It is yet still another object of the present invention to provide a servo/feedback loop for an optical system, referred to as a "wavelength-locked loop," that enables real time alignment and tracking of laser center wavelengths and filter passband center wavelengths in multi-gigabit laser/optical systems such that lower cost lasers and filters may be used providing a significant cost reduction in the WDM equipment.

Thus, according to the principles of the invention, there is provided a wavelength-locked loop servo-control circuit and methodology that enables real time mutual alignment of an electromagnetic signal having a peaked spectrum function including a center wavelength and a wavelength selective device implementing a peaked passband function including a center wavelength, in a system employing electromagnetic waves. The system and method employs the steps of: a) applying a dither modulation signal at a dither modulation frequency to an electromagnetic signal operating at a specific wavelength, and inputting the dither modulated electromagnetic signal to the wavelength selective device having a peak frequency response at a desired wavelength; b) converting a portion of the dither modulated electromagnetic signal to an electric feedback signal; c) continuously comparing the feedback signal with the dither modulation signal and generating an error signal representing a difference between a frequency characteristic of the feedback signal and a dither modulation frequency; and d) adjusting the peak spectrum function of the electromagnetic signal according to the error signal, wherein the center wavelength of the electromagnetic signal and the wavelength selective device center wavelength become aligned when the frequency characteristic of the feedback signal is two times the dither modulation frequency.

The systems employing the wavelength-locked loop may be information carrying or control systems employing electromagnetic waves including those waves at radio frequency, microwave frequency and optical frequency portions of an electromagnetic frequency spectrum. Thus, the electromagnetic signals may comprise radio frequency signals, microwave signals, and optical signals.

When employed in laser/optical networks, the system and method of the present invention may be used to tune laser diode devices, and/or compensate for any type of wavelength-selective element in the network, including wavelength selective filters, attenuators, and switches, in fiber Bragg gratings, ring resonators in optical amplifiers, external modulators such as acousto-optic tunable filters, or array waveguide gratings. This applies to many other optical components in the network as well (for example, optical amplifiers that may act as filters when operating in the nonlinear regime). Furthermore, the system and method of the invention may be used to implement less expensive devices for all of the above application areas.

Alternately, the system and method of the invention may be implemented to tune such devices for WDM and optical network applications, in real-time, during manufacture, e.g., tuning all lasers to a specific wavelength. This would significantly increase lot yields of laser devices which otherwise may be discarded as not meeting wavelength specifications as a result of manufacture process variations, for example.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF PREFERRED EMBODIMENTS

The present invention is a novel servo-control system implemented for optical systems including light sources, such as lasers, and frequency selective devices, such as bandpass filters. The servo-control system, herein referred to as the "wavelength-locked loop" or "lambda-locked loop" (since the symbol lambda is commonly used to denote wavelength), implements a dither modulation to continuously adjust an electromagnetic signal source characterized as having a peaked frequency spectrum or peaked center wavelength, e.g., laser light, so as to track the center of a frequency selective device, e.g. a filter passband. In this manner, optimal power of the signal is transmitted and optimal use is made of the system transmission bandwidth.

Figure 1A:
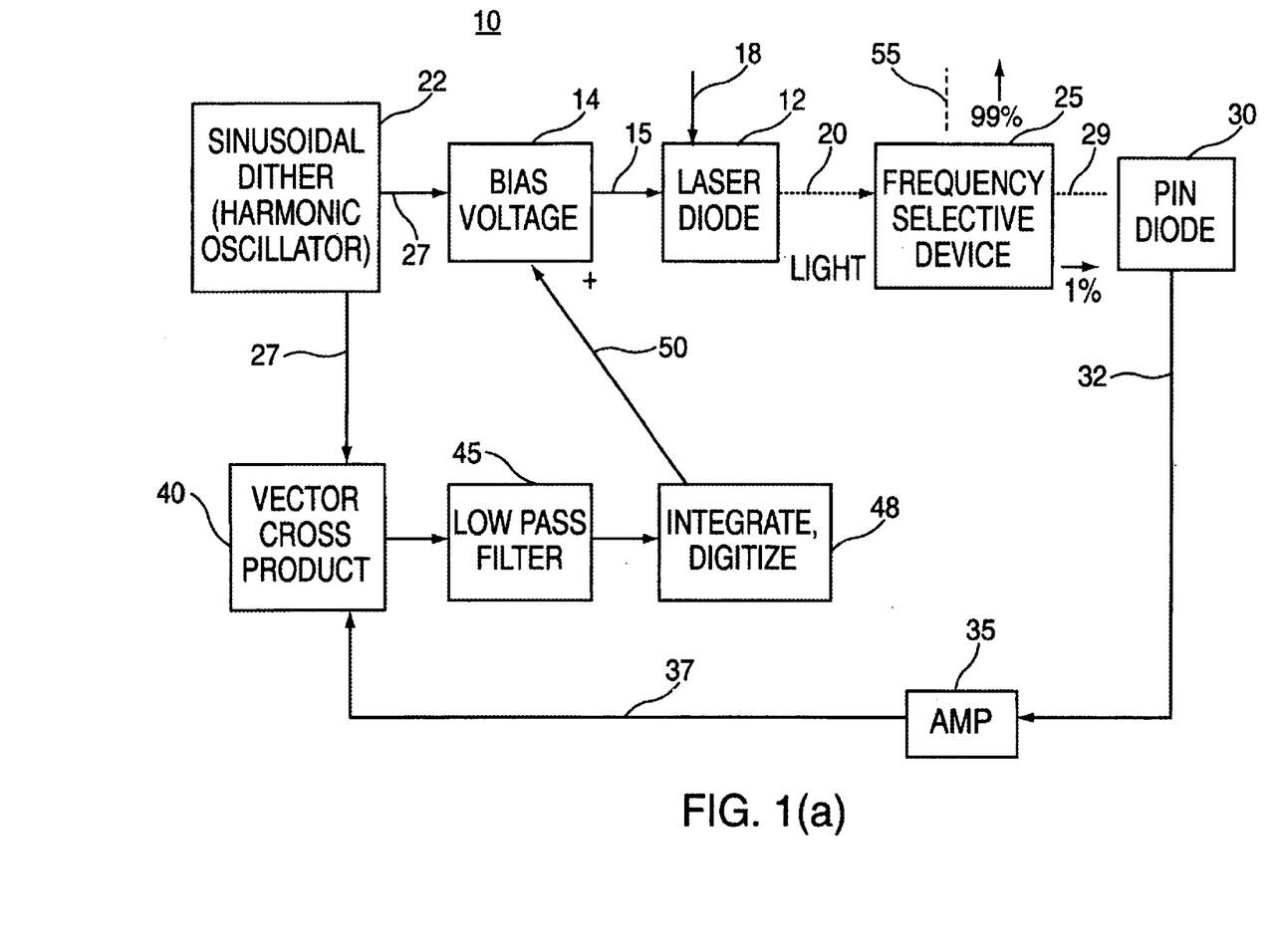
FIGS. 1(a) and 1(b) depict the underlying system architecture for employing the wavelength-locked loop technique according to the principles of the present invention.

The basic operating principle of the wavelength-locked loop (WLL) is now described with reference to FIG. 1(a), which depicts an example optical system 10 including a light source such as laser diode 12 driven with both a bias voltage 15 from a voltage bias circuit 14, and modulated data 18 from a data source (not shown). The laser diode generates an optical (laser light) signal 20 that is received by a bandpass filter 25 or, any frequency selective device including but not limited to: thin film optical interference filters, acousto-optic filters, electro-optic filters, diffraction gratings, prisms, fiber Bragg gratings, integrated optics interferometers, electroabsorption filters, and liquid crystals. The laser diode itself may comprise a standard Fabry Perot or any other type (e.g., Vertical Cavity Surface Emitting (VCSEL)), light emitting diodes, or, may comprise a Distributed Feedback semiconductor laser diode (DFB) such as commonly used for wavelength multiplexing. Preferably, the laser diode emits light in the range of 850 nm to 1550 nm wavelength range. As mentioned, the bandpass filter may comprise a thin film interference filter comprising multiple layers of alternating refractive indices on a transparent substrate, e.g., glass. As further shown in FIG. 1(a), according to the invention, there is an added sinusoidal dither modulation circuit or oscillator 22 for generating a sinusoidal dither modulation signal 27 that modulates the laser bias voltage.

The sinusoidal dither signal may be electronically produced, e.g., by varying the current for a laser, or mechanically, by varying the micro-electromechanical system's (MEMS) mirror to vary the wavelength. The dither modulation frequency is on the order of a few kilohertz (kHz) but may range to the Megahertz range. Preferably, the dither modulation frequency is much less than the data rate which is typically on the order of 1–10 GHz. Modulation of the laser diode bias current 15 in this manner causes a corresponding dither in the laser center wavelength. Modulated data is then imposed on the laser, and the optical output passes through the bandpass filter 25. Preferably, the filter 25 is designed to tap off a small amount of light 29, for example, which is incident upon a photo detector receiver device, e.g., P-I-N diode 30, and converted into an electrical feedback signal 32. The amount of light that may be tapped off may range anywhere between one percent (1%) to five percent (5%) of the optical output signal, for example, however, skilled artisans will appreciate any amount of laser light above the noise level that retains the integrity of the output signal including the dither modulation characteristic, may be tapped off. The remaining laser light passes on through the filter 25 to the optical network (not shown). As the PIN diode output 32 is a relatively weak electric signal, the resultant feedback signal is amplified by amplifier device 35 to boost the signal strength. The amplified electric feedback signal 37 is input to a multiplier device 40 where it is combined with the original dither modulation signal 35. The cross product signal 42 that results from the multiplication of the amplified PIN diode output (feedback signal) 37 and the dither signal 35 includes terms at the sum and difference of the dither frequencies. The result is thus input to a low pass filter device 45 where it is low pass filtered and then averaged by integrator circuit 48 to produce an error signal 50 which is positive or negative depending on whether the laser center wavelength is respectively less than or greater than the center point of the bandpass filter. The error signal 50 is input to the laser bias voltage device 15 where it may be added (e.g., by an adder device, not shown) in order to correct the laser bias current 15 in the appropriate direction. In this manner, the bias current (and laser wavelength) will increase or decrease until it exactly matches the center of the filter passband. Alternately, the error signal 50 may be first converted to a digital form, prior to input to the bias voltage device.

Figure 1B:
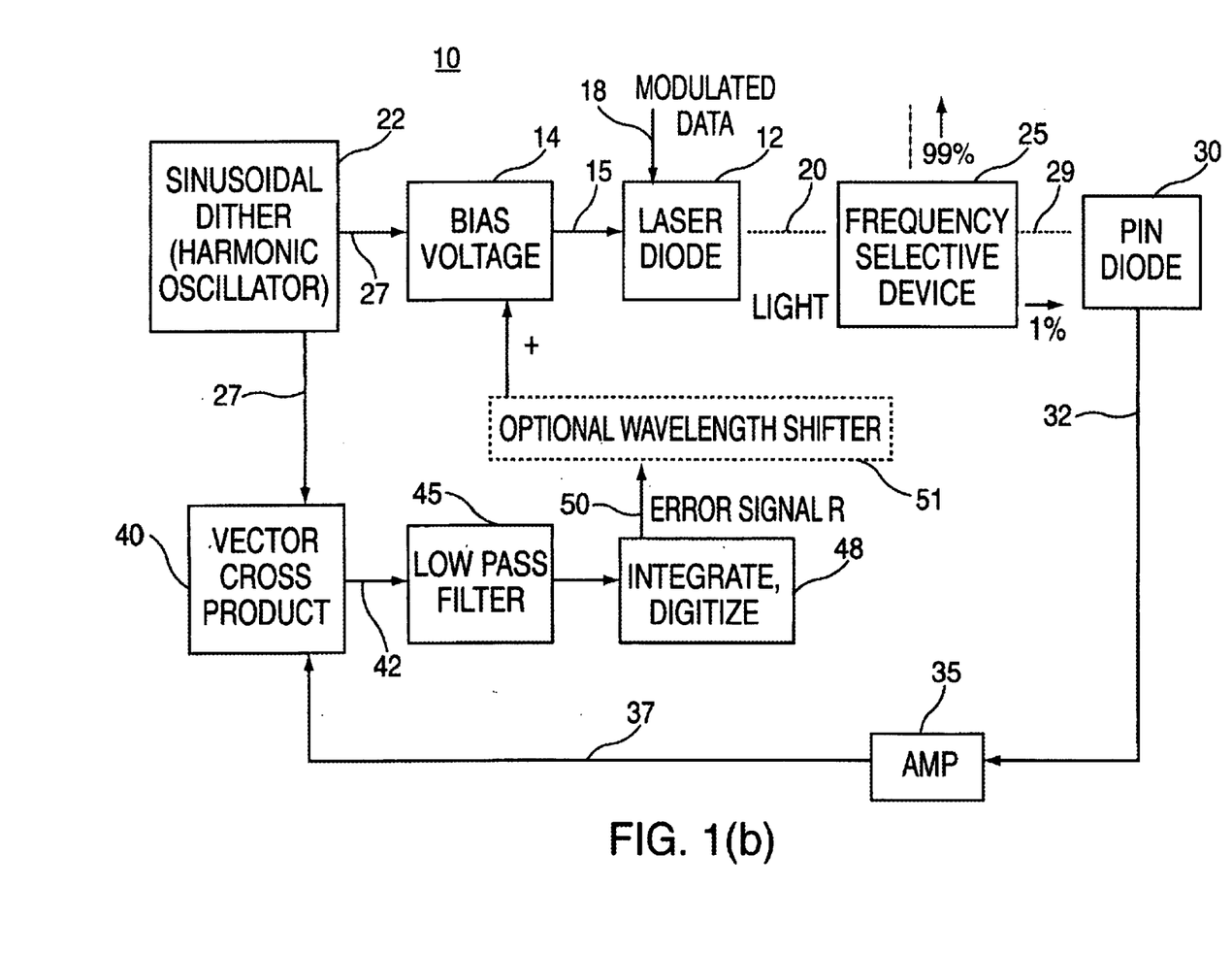
Figure 2:
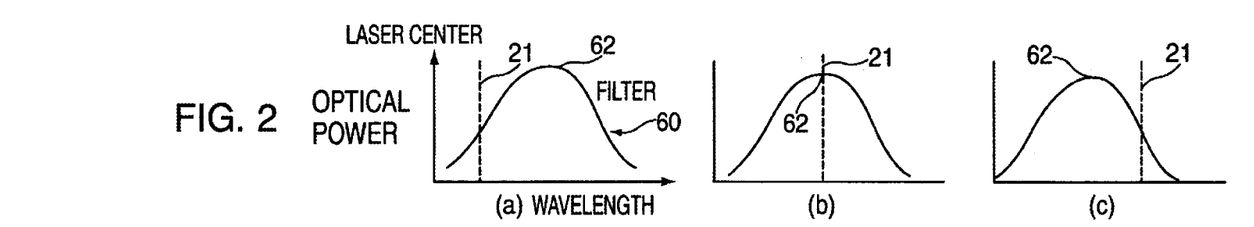
FIGS. 2(a)–2(c) are signal waveform diagrams depicting the relationship between laser optical power as a function of wavelength for three instances of optic laser signals.
Figure 3:
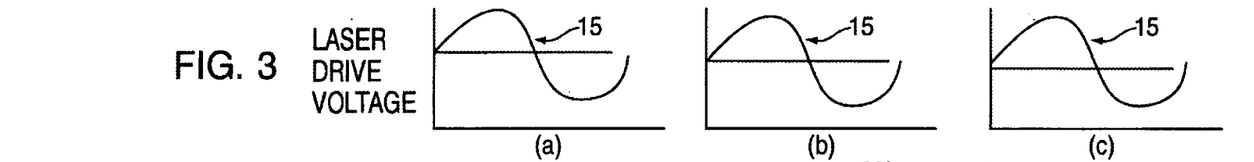
FIGS. 3(a)–3(c) are signal waveform diagrams depicting the laser diode drive voltage dither modulation (a sinusoid) for each of the three waveform diagrams of FIGS. 2(a)–2(c)
Figure 4:
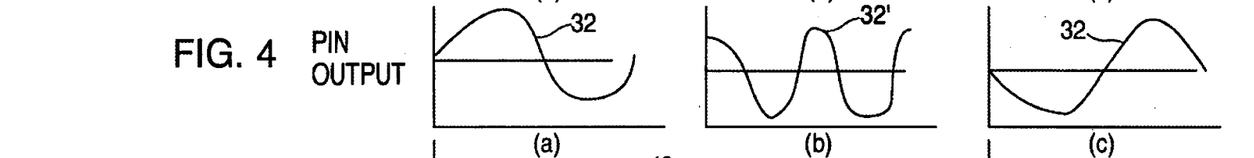
FIGS. 4(a)–4(c) are signal waveform diagrams depicting the resulting feedback error signal output of the PIN diode for each of the three waveform diagrams of FIGS. 2(a)–2(c)

According to one aspect of the invention, the WLL will automatically maintain tracking of the laser center wavelength to the peak of the optical filter. However, in some cases, it may not be desirable to enable laser alignment to the filter peak, e.g., in an optical attenuator. Thus, as shown in the embodiment depicted in FIG. 1(b), there is provided an optional external tuning circuit, herein referred to as a wavelength shifter device 51, that receives the error signal and varies or offsets it so that the laser center wavelength may be shifted or offset in a predetermined manner according to a particular network application. That is, the wavelength shifter 51 allows some external input, e.g., a manual control element such as a knob, to introduce an arbitrary, fixed offset between the laser center wavelength and the filter peak.

Figure 7:
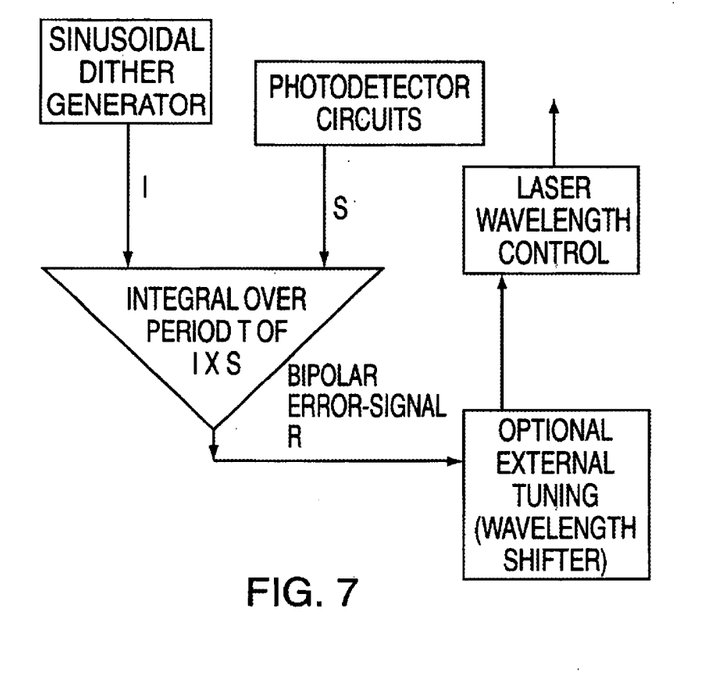
FIG. 7 is a generalized circuit diagram depicting how dithering is implemented in the WLL system of the present invention.

A generalized description of how dithering is implemented for providing a WLL in the present invention is now provided in view of FIG. 7. As shown in FIG. 7, the sinusoidal dither generator (harmonic oscillator) 22 produces a dither signal 27 which causes the laser center wavelength to oscillate with a small amplitude about its nominal position. After passing thru the optical bandpass filter, the laser wavelength variation is converted into intensity variation which is detected by the photodetector circuit 30 (e.g., photodiode). The servo loop feeds back the photodiode output signal, S, and takes a vector cross product with the original sinusoidal dither, I. The cross product result is averaged (integrated) over a time period T and may be sampled and digitized to produce the equivalent of an error detect signal, R, which is bipolar and proportional to the amount by which the laser center wavelength and filter center wavelength are misaligned. Optionally, the signals may be normalized to account for variations in the laser power output from the filter. Optionally, an external tuning circuit may be implemented to receive the error signal and enable the laser center wavelength offset to vary to an arbitrary value. Finally, the error signal R is fed back and added to the laser bias voltage to produce a DC offset in the bias voltage which in turn adjusts the laser center wavelength in the proper direction to better align with the filter center wavelength. This is the technique that is exploited to create a tunable laser, tunable filters, variable attenuators, etc.

The operating principle is further illustrated in the timing and signal diagrams of FIGS. 2–6. FIGS. 2(a)–2(c) particularly depicts the relationship between laser optical power as a function of wavelength for three instances of optic laser signals: a first instance (FIG. 2(a)) where the laser signal frequency center point 21 is less than the bandpass function centerpoint as indicated by the filter bandpass function 60 having centerpoint 62 as shown superimposed in the figures; a second instance (FIG. 2(b)) where the laser frequency center point 21 is aligned with the bandpass function centerpoint 62; and, a third instance (FIG. 2(c)) where the laser frequency center point 21 is greater than the bandpass function centerpoint 62. In each instance, as depicted in corresponding FIGS. 3(a)–3(c), the laser diode drive voltage signal 15 is shown dithered (a sinusoid) resulting in the laser wavelength dithering in the same manner. The dithered laser diode spectra passes through the filter, and is converted to electrical form by the PIN diode 30. In each instance of the laser signals depicted in FIGS. 2(a) and 2(c) having frequency centerpoints respectively less than and greater than the band pass filter centerpoint, it is the case that the dither harmonic spectra does not pass through the frequency peak or centerpoint of the bandpass filter. Consequently, the resulting output of the PIN diode is an electric sinusoidal signal of the same frequency as the dither frequency such as depicted in corresponding FIGS. 4(a) and 4(c). It is noted that for the laser signals at frequencies below the peak (FIG. 2(a)) the feedback error signal 32 corresponds in frequency and phase to the dither signal (FIG. 4(a)), however for the laser signals at frequencies above the peak (FIG. 2(c)) the feedback error signal 32 corresponds in frequency but is 180° opposite phase of the dither signal (FIG. 4(c)). Due to the bipolar nature of the feedback signal (error signal) for cases when the laser signal centerpoint is misaligned with the bandpass filter centerpoint, it is thus known in what direction to drive the laser diode (magnitude and direction), which phenomena may be exploited in many different applications. For the laser signal depicted in FIG. 2(b) having the laser frequency center point aligned with the bandpass function centerpoint, the dither harmonic spectra is aligned with and passes through the frequency peak (maximum) of the bandpass filter twice. That is, during one cycle (a complete round trip of the sinusoid dither signal), the dither signal passes though the centerpoint twice. This results in a frequency doubling of the dither frequency of the feedback signal 32, i.e., a unique frequency doubling signature, as depicted as PIN diode output 32' in FIG. 4(b) showing an feedback error signal at twice the frequency of the dither frequency.

Thus, in each instance, as depicted in corresponding FIG. 4(b), the resulting feedback signal exhibits frequency doubling if the laser center wavelength is aligned with the filter center wavelength; otherwise it generates a signal with the same dither frequency, which is either in phase (FIG. 4(a)) or out of phase (FIG. 4(c)) with the original dither modulation. It should be understood that, for the case where the laser center frequency is misaligned with the bandpass filter peak and yet there is exhibited partial overlap of the dither spectra through the bandpass filter peak (i.e., the centerpoint peak is traversed twice in a dither cycle), the PIN diode will detect partial frequency doubling at opposite phases depending upon whether the laser center frequency is inboard or outboard of the filter center frequency. Thus, even though partial frequency doubling is detected, it may still be detected from the feedback signal in which direction and magnitude the laser signal should be driven for alignment.

Figure 5:
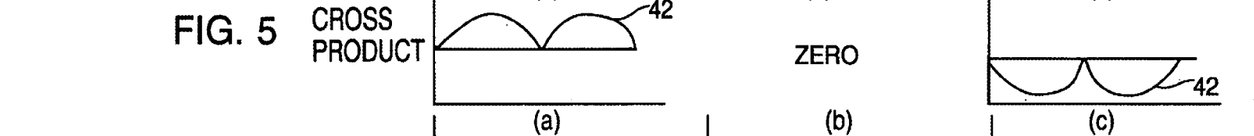
FIGS. 5(a)–5(c) are signal waveform diagrams depicting the cross product signal resulting from the mixing of the amplified feedback error with the original dither sinusoid.
Figure 6:
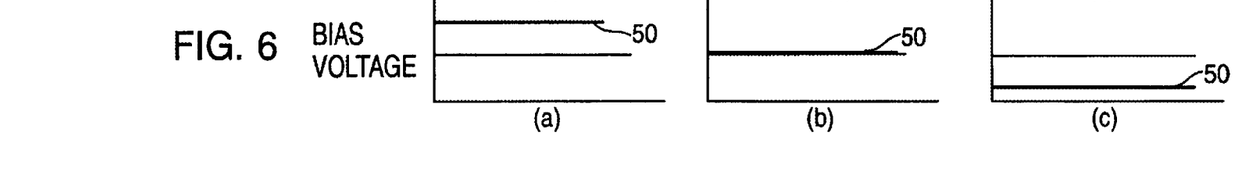
FIGS. 6(a)–6(c) are signal waveform diagrams depicting the rectified output laser bias voltage signals which are fed back to adjust the laser current and center frequency.

Thus, referring now to FIGS. 5(a) and 5(c), for the case when the laser and filter are not aligned, the cross product signal 42 resulting from the mixing of the amplified feedback error with the original dither sinusoid is a signed error signal either at a first polarity (for the laser signals at frequencies below the bandpass filter centerpoint), such as shown in FIG. 5(a) or, at a second polarity (for the laser signals at frequencies above the bandpass filter centerpoint), such as shown in FIG. 5(c). Each of these signals may be rectified and converted into a digital output laser bias voltage signal 48 as shown in respective FIGS. 6(a) and 6(c), which are fed back to respectively increase or decrease the laser current (wavelength) in such a way that the laser center wavelength moves closer to the bandpass filter centerpoint. For the case when the laser and filter are aligned, the cross product generated is the frequency doubled signal (twice the frequency of the dither) as shown in the figures. Consequently, this results in a 0 V dc bias voltage (FIG. 6(b)) which will maintain the laser frequency centerpoint at its current wavelength value.

In order to describe further benefits of the invention, it is first noted that although it may appear that if a filter bandpass is larger than the laser linewidth, then the entire optical pulse will pass through the filter unaffected. However, this is clearly not the case; the laser spectra and filter function are both Gaussian, in both time and frequency. Thus, passing the laser spectra through the filter results in a convolution between the spectrum and filter functions. Implementing analog signal processing, an output optical spectrum is produced which is actually narrower than the input spectra (i.e., some of the light is lost during filtering). In a real WDM system there may be at least two (2) bandpass filter devices in a link to perform multiplex/demux functions at either end: in practice, there may be many bandpass filters configured in series. This leads to a secondary problem: when two filters are in series and their bandpass centers are not aligned, the original signal must be convolved with both filter functions; this narrows the signal spectra even further, at the cost of lowering the optical power by discarding the edges of the light spectra. A succession of filters not aligned with each other can be shown to have the same characteristics as a single, much narrower, filter. This further reduces the margin for misalignment between the laser and multiple filters. For example, even if the ideal center to center, wavelength spacing of a WDM system is 0.8 nm, due to misalignment between the mux and demux filters this window may be reduced to approximately 0.4 nm or less. This would require extreme precision and stability for the laser wavelength, making for a very expensive laser transmitter. Thus, there are really two problems to be solved: (1) laser to filter alignment; and, (2) filter to filter alignment. Note that when signals propagate through a fiber optic network and traverse multiple filters the wavelength may shift due to these effects combined with temperature and environmental effects. It is a real, practical problem to keep an input wavelength the same throughout the network, so that network architectures such as ring mesh, wavelength reuse, and wavelength conversion may work properly, i.e., this is called frequency referencing.

Figure 8:
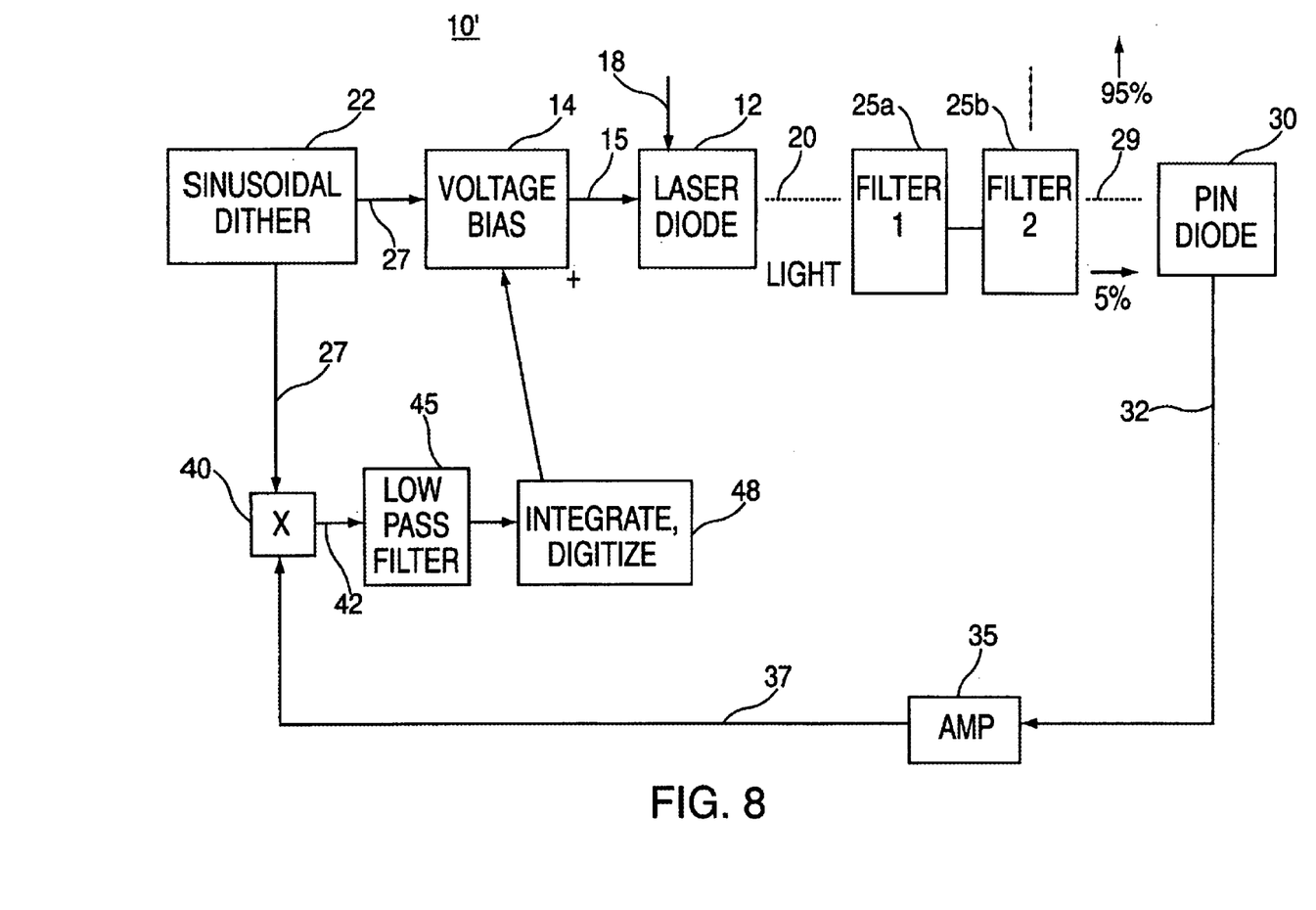
FIG. 8 is a general block diagram depicting the underlying system architecture for employing the wavelength-locked loop technique in an optical system employing two bandpass filters according to the present invention.
Figure 9:
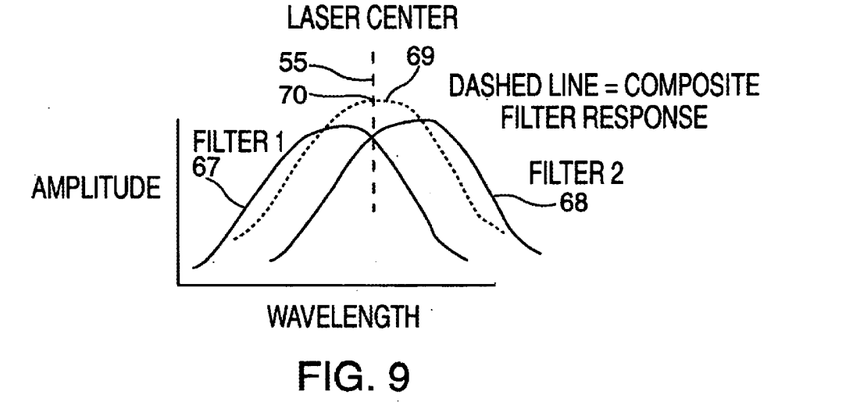
FIG. 9 is a signal waveform diagram depicting the relationship between laser optical power as a function of wavelength for the case of aligning a laser signal through a system including two bandpass filters in series, as depicted in FIG. 8.

The present invention addresses frequency referencing as it can handle both of these instances. For example, as shown in FIG. 8, there is depicted a general block diagram depicting the underlying system architecture employing the wavelength-locked loop technique in an optical system 10' employing a series connection of two bandpass filters 25a, 25b. FIG. 9 depicts each of the individual filter responses 67 and 68 for the two bandpass filters 25a, 25b of FIG. 8 and the corresponding composite filter response 69 having a centerpoint or peak 70. When performing filter to filter or multiple filter alignment, the technique of the invention depicted in FIG. 8 may be implemented to tune the laser signal 55 to have a center frequency such that maximum power transfer will occur through the series connection of two bandpass filters as represented by its composite filter response 69 (FIG. 9). Generally, a cascade of bandpass filters results in an effective narrowing of the overall passband, as the net filter response is a convolution of the component filter responses. The WLL can align the laser center wavelength with the middle of this composite passband.

The system and method of present invention may be used to tune a laser wavelength to compensate for any type of wavelength-selective element in a network, including wavelength selective switches, tunable filters, in fiber Bragg gratings, ring resonators in optical amplifiers, external modulators such as acousto-optic tunable filters, or array waveguide gratings. This applies to many other optical components in the network as well (for example, optical amplifiers that can act as filters when operating in the nonlinear regime). This method may additionally be used to implement less expensive devices for all of the above application areas. As the optical loss of a WDM filter/laser combination is greatly reduced by implementing the technique of the invention, significantly larger link budgets and longer distances may be supported. Further, the invention permits much lower cost lasers and filters to be used; since these are the most expensive parts of a WDM device today, there is a significant cost reduction in the WDM equipment.

Figure 10:
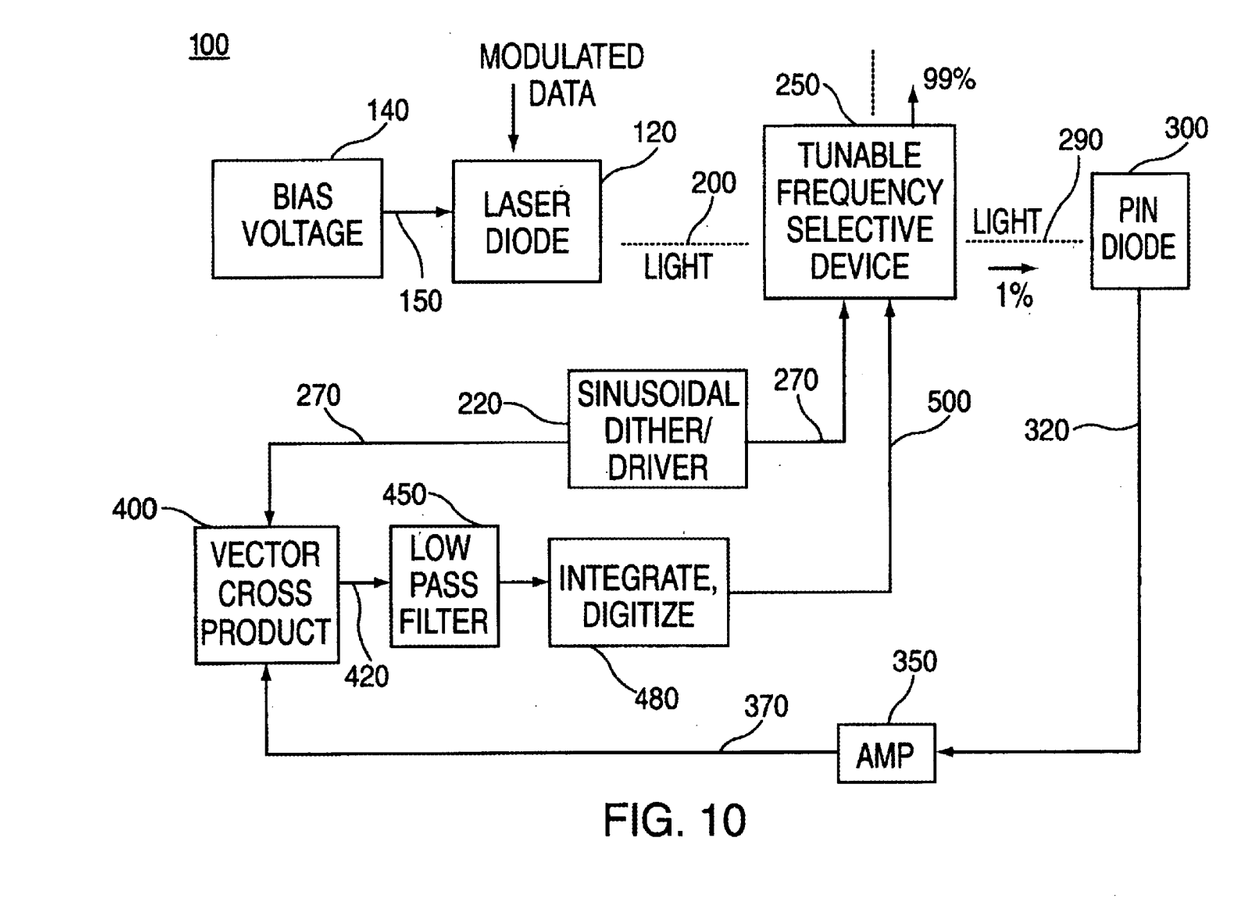
FIG. 10 is a general block diagram depicting the underlying system architecture for tuning tunable frequency selective devices such as a bandpass filter according to the principles of the present invention.

As an example there is depicted in FIG. 10 implementation of the WLL servo-control system 100 for tuning tunable frequency selective devices such as a bandpass filter for a variety of optical network applications, e.g., optical attenuators, optical gain control circuits, etc. As shown in FIG. 10, a bias voltage device 140 applies a bias signal to the laser diode 120 for generating an optical signal 200 having a peaked spectrum function. This light signal is input to a tunable frequency selective device 250, e.g., a tunable bandpass filter. As shown in FIG. 10, however, a sinusoidal dither/driver device 220 is implemented for modulating the peak center frequency of filter pass band with a small dither signal 270. A small amount of light 290 is tapped off the output of the filter 250 for input to the photodetector device, e.g., PIN diode 300, where the optical signal is converted to electrical signal 320, amplified by amplifier device 350, and input to the mixer device 400 which additionally receives the dither signal 270. The mixer device generates the vector cross product 420 of the amplified feedback signal 370 with the dither signal 270 and that result is low-pass filtered, and smoothed (e.g., integrated) by integrator device 480 to provide error signal 500, in the manner discussed herein with reference to FIGS. 2–6. This error signal 500 may be a bi-polar signal and may be used to dynamically adjust the peak center frequency of the filter passband until it matches the center frequency of the laser signal input 200.

Figure 11:
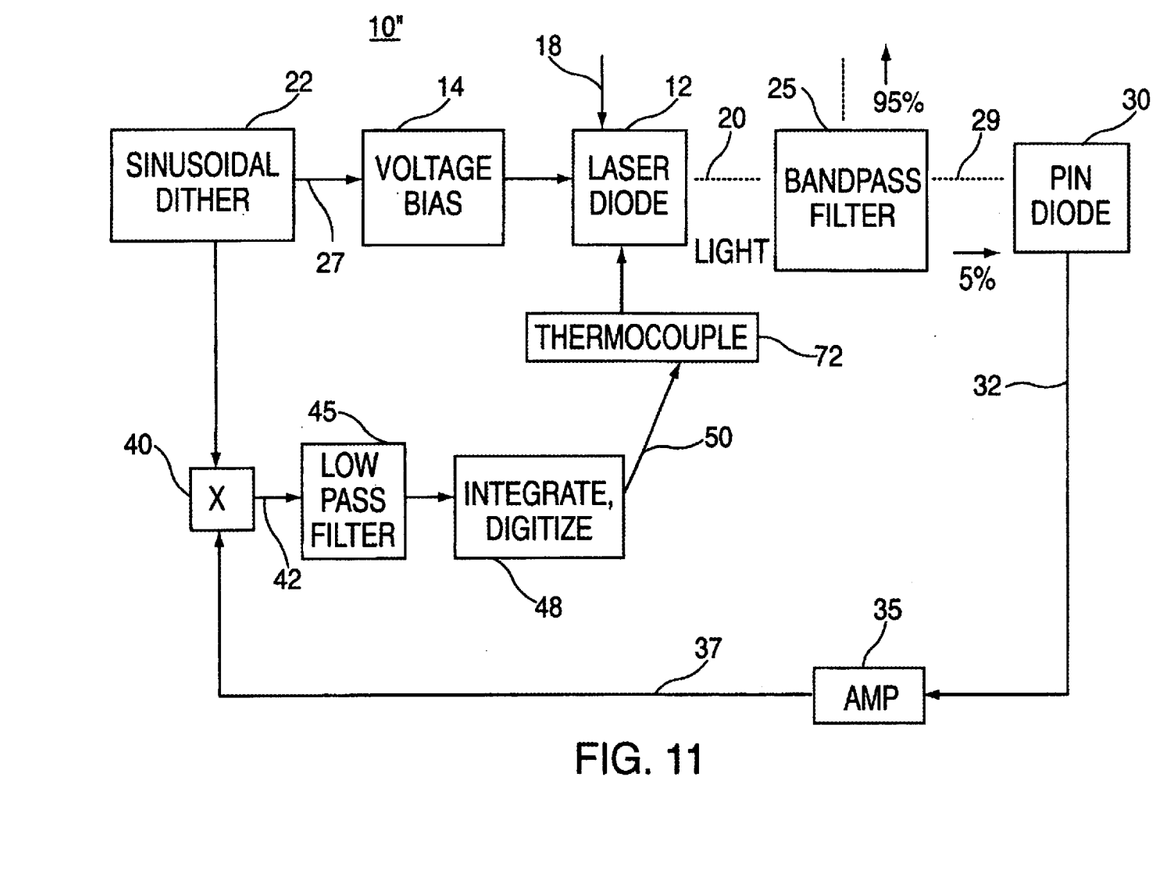
FIG. 11 is a general block diagram depicting the underlying system architecture of the present invention employing a thermocouple or similar temperature transducer element to adjust the laser wavelength by varying the temperature of the laser diode element according to the error signal.

Further advantages achieved by implementing the system and method of the invention include: enable compensation for end of life effects that cause wavelength drift, extending the lifetime and reliability of lasers; overcoming frequency chirp and relaxation oscillations without requiring costly design changes, and permitting lasers to be driven at their full power and modulation capacity; and, enable compensation for thermal drift of the laser. For instance, as an alternate embodiment depicted in the system architecture 10" shown in FIG. 11, a thermocouple or similar temperature transducer element 72 may be used to adjust the laser wavelength by varying the temperature of the laser diode element 12 according to the error signal 48, rather than adjusting the bias current input to laser diode element. Thus, it is contemplated that thermo-optic modulators may be used in an application of the invention. Further, the system and method of the invention may be implemented for use as an external cavity modulator for the laser, by detuning the laser center wavelength from the filter peak to regulate the laser optical power.

Figure 12:
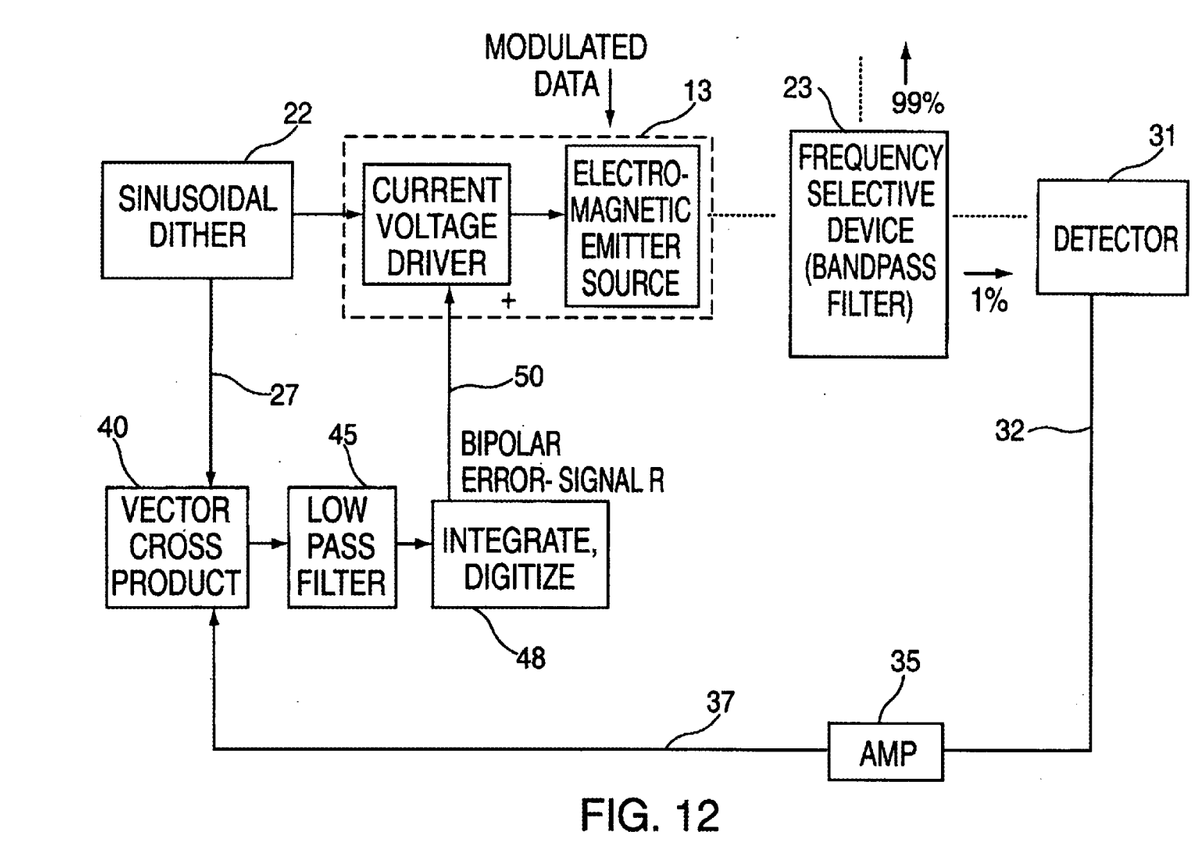
FIG. 12 is a generic block diagram depicting the underlying system architecture for implementing the wavelength-locked loop principle.

It should be understood that the wavelength-locked loop principle may be implemented for aligning any electromagnetic signal having a peaked spectrum function including a center wavelength and a wavelength selective device implementing a peaked passband function including a center wavelength, in any system employing electromagnetic signals (e.g., of radio, microwave and optical frequency spectra), and may be implemented for tuning or adjusting the electromagnetic wave source or alternately, tuning or adjusting the transmission properties of frequency selective devices such as tunable filters implemented in such systems. FIG. 12 illustrates the generic system for implementing the wavelength-locked loop principle employed in an information carrying or control system employing electromagnetic signals, e.g., in the microwave or RF frequency range, that have a peaked spectrum function. Such an electromagnetic signal generator is depicted in FIG. 12 as a combination of a current or voltage driver and an electromagnetic signal source 13. For example, when employed in microwave networks, the emitter source may comprise a Klystron device, the wavelength selective filter may comprise a surface acoustic wave (SAW) filter 13 and the detector may comprise any electromagnetic field detector 31.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A wavelength-locked loop servo-control circuit that enables real time mutual alignment of an electromagnetic signal having a peaked spectrum function including a center wavelength and a wavelength selective means for implementing a peaked passband function including a center wavelength, in a system employing electromagnetic waves, said circuit comprising:
    means for applying a dither modulation signal at a dither modulation frequency to said electromagnetic signal to generate a dither modulated electromagnetic signal, and inputting said dither modulated electromagnetic signal to said wavelength selective means;
    means for converting a portion of said dither modulated electromagnetic signal to an electric feedback signal;
    means for generating an error signal comprising a vector cross product of said feedback signal and said dither modulation signal; and
    means for adjusting the peak spectrum function of said electromagnetic signal according to said error signal, wherein said center wavelength of said electromagnetic signal becomes aligned with said center wavelength of said wavelength selective means when a frequency characteristic of said feedback signal is two times said dither modulation frequency.

2. The wavelength-locked loop servo-control circuit as claimed in claim 1, wherein said electromagnetic waves include those waves at frequencies selected from the group consisting of: radio frequency, microwave frequency and optical frequency portions of an electromagnetic frequency spectrum, said electromagnetic signal comprising one of: a radio frequency signal, microwave signal, and optical signal, respectively.

3. The wavelength-locked loop servo-control circuit as claimed in claim 2, wherein said optical signal comprises a laser signal employed in an optical network, said optical network including:
    a laser diode device for generating said laser signal; and,
    a laser bias voltage control circuit for providing a bias voltage to a laser diode device for controlling said laser signal, wherein said mechanism for adjusting said optical signal includes applying said error signal to said laser bias control circuit for adjusting a center wavelength characteristic of said laser signal.

4. The wavelength-locked loop servo-control circuit as claimed in claim 2, wherein said electromagnetic signal is employed in an information carrying system employing microwaves, said information carrying system including:
    a microwave generator device for generating said microwave signal; and,
    a driver control circuit for providing a drive signal to said microwave generator device for controlling said microwave signal, wherein said mechanism for adjusting said microwave signal includes applying said error signal to said driver control circuit for adjusting a center wavelength characteristic of said microwave signal.

5. The wavelength-locked loop servo-control circuit as claimed in claim 1, wherein said wavelength selective device includes a bandpass filter having a desired wavelength representing a filter passband center wavelength, wherein said electromagnetic signal is tuned to said passband center wavelength so that signal power is maximally transmitted through said bandpass filter in said system.

6. The wavelength-locked loop servo-control circuit as claimed in claim 1, wherein said wavelength selective device comprises multiple bandpass filters in series, said multiple bandpass filters exhibiting a composite filter response representing a passband center wavelength, wherein said electromagnetic signal is tuned to said passband center wavelength so that signal power is maximally transmitted through said series of multiple bandpass filters in said system.

7. The wavelength-locked loop servo-control circuit as claimed in claim 1, wherein said device for applying a dither modulation to said bias signal is a sinusoidal dither circuit for generating a sinusoidal dither modulation signal of a predetermined frequency.

8. The wavelength-locked loop servo-control circuit as claimed in claim 2, wherein said converting mechanism includes one selected from the group of: a radio frequency detector, a microwave detector, and an optical signal detector device.

9. The wavelength-locked loop servo-control circuit as claimed in claim 8, wherein said optical signal detector includes a photodetector.

10. The wavelength-locked loop servo-control circuit as claimed in claim 8, wherein said microwave signal detector includes a surface acoustic wave detector.

11. The wavelength-locked loop servo-control circuit as claimed in claim 7, wherein said means for generating an error signal comprising a vector cross product includes a mixer capable of combining said converted feedback signal with said sinusoidal dither modulation signal and generating a vector cross-product signal having components representing a sum and difference at dither frequencies.

12. The wavelength-locked loop servo-control circuit as claimed in claim 11, further including:
  low-pass filter device for filtering said output cross-product signal; and
  integrator circuit for averaging said output cross-product signal to generate said error signal, whereby said error signal is positive or negative depending on whether a center wavelength of said electromagnetic signal is respectively less than or greater than said desired wavelength of said wavelength selective device.

13. The wavelength-locked loop servo-control circuit as claimed in claim 1, further including wavelength shifter device for receiving said error signal and varying said error signal in an amount to offset the electromagnetic signal center wavelength in a predetermined manner.

14. The wavelength-locked loop servo-control circuit as claimed in claim 3, further including thermocouple device for receiving said error signal and modifying a temperature of said laser diode for adjusting a frequency of said laser signal in an appropriate direction according to said error signal.

15. The wavelength-locked loop servo-control circuit as claimed in claim 3, wherein said wavelength selective device includes an optical amplifier.

16. The wavelength-locked loop servo-control circuit as claimed in claim 3, wherein said wavelength selective device includes an optical attenuator.

17. The wavelength-locked loop servo-control circuit as claimed in claim 3, wherein said wavelength selective device includes an optical switch.

18. A wavelength-locked loop servo-control circuit that enables real time mutual alignment of an electromagnetic signal having a peaked spectrum function including a center wavelength and a tunable wavelength selective means for implementing a peaked passband function including a center wavelength, in a system employing electromagnetic waves, said circuit comprising:
  means for applying a dither modulation signal at a dither modulation frequency to said tunable wavelength selective means, said tunable wavelength selective means further receiving an electromagnetic signal having a center wavelength and generating a dither modulated optical signal for output thereof;
  means for converting a portion of said dither modulated electromagnetic signal to an electric feedback signal;
  means for generating an error signal comprising a vector cross product of said feedback signal and said dither modulation signal; and
  means for adjusting a passband center wavelength of said tunable wavelength selective means according to said error signal, wherein said center wavelength of said electromagnetic signal becomes aligned with said center wavelength of said tunable wavelength selective means when a frequency characteristic of said feedback signal is two times said dither modulation frequency.

19. The wavelength-locked loop servo-control circuit as claimed in claim 18, wherein said electromagnetic signal is a laser signal exhibiting a peaked spectrum function having a center wavelength.

20. The wavelength-locked loop servo-control circuit as claimed in claim 19, wherein said tunable wavelength selective device includes a bandpass filter having a tunable passband center wavelength, wherein said tunable passband center wavelength is tuned to a center wavelength of said laser signal so that optical signal power is maximally transmitted through said bandpass filter.

21. A method for mutually aligning a center wavelength of an electromagnetic signal having a peaked spectrum function with a center wavelength of a wavelength selective means for implementing a peaked passband function including a center wavelength, in a system employing electromagnetic waves, said method comprising the steps of:
  a) applying a dither modulation signal at a dither modulation frequency to said electromagnetic signal operating at a specific wavelength, and inputting said dither modulated electromagnetic signal to said wavelength selective means having a peak frequency response at a desired wavelength;
  b) converting a portion of said dither modulated electromagnetic signal to an electric feedback signal;
  c) generating an error signal comprising a vector cross product of said feedback signal and said dither modulation signal; and
  d) adjusting the peak spectrum function of said electromagnetic signal according to said error signal, wherein said center wavelength of said electromagnetic signal becomes aligned with said center wavelength of said wavelength selective means when said frequency characteristic of said feedback signal is two times said dither modulation frequency.

22. The method as claimed in claim 21, wherein said electromagnetic signal is a laser signal having a center wavelength, said optical network including a laser diode device for generating said laser signal and, a laser bias voltage control circuit for providing a bias voltage to a laser diode device for controlling said laser signal, wherein said adjusting step d) includes applying said error signal to said laser bias control circuit for adjusting a center wavelength characteristic of said laser signal.

23. The method as claimed in claim 21, wherein said wavelength selective device includes a bandpass filter having a desired wavelength representing a filter passband center wavelength, said method including tuning said electromagnetic signal to said passband center wavelength so that electromagnetic signal power is maximally transmitted through said bandpass filter in said system.

24. The method as claimed in claim 21, wherein said wavelength selective device comprises multiple bandpass filters in series, said multiple bandpass filters exhibiting a composite filter response representing a passband center wavelength, said method including tuning said optical signal to said passband center wavelength so that optical signal power is maximally transmitted through said series of multiple bandpass filters in said optical system.

25. The method as claimed in claim 21, wherein said generating step c) includes the steps of:
combining said converted feedback signal with said dither modulation signal and generating a vector cross-product signal having components representing a sum and difference at dither frequencies,
filtering said output cross-product signal; and
averaging said output cross-product signal to generate said error signal, said error signal being positive or negative depending on whether a center wavelength of said electromagnetic signal is respectively less than or greater than said desired wavelength of said wavelength selective device.

26. The method as claimed in claim 21, wherein said adjusting step e) includes the step of: receiving said error signal and varying said error signal in an amount to offset the electromagnetic signal center wavelength in a predetermined manner.

27. The method as claimed in claim 22, wherein said step of modifying the bias signal includes the step of providing a thermocouple device for receiving said error signal and modifying a temperature of said laser diode for adjusting a frequency of said laser signal in an appropriate direction according to said error signal.

28. A method for mutually aligning a center wavelength of an electromagnetic signal of having a peaked spectrum function with a center wavelength of a wavelength selective means fur implementing a peaked passband function including a center wavelength, in a system employing electromagnetic waves, said method comprising the steps of:
a) applying a dither modulation signal at a dither modulation frequency to said tunable wavelength selective device, said tunable wavelength selective means further receiving an electromagnetic signal having a center wavelength and generating a dither modulated electromagnetic signal for output thereof;
b) converting a portion of said dither modulated electromagnetic signal to an electric feedback signal;
c) generating an error signal comprising a vector cross product of said feedback signal and said dither modulation signal; and
d) adjusting a passband center wavelength of said tunable wavelength selective means according to said error signal, wherein said center wavelength of said electromagnetic signal becomes aligned with said center wavelength of said tunable wavelength selective means when said frequency characteristic of said feedback signal is two times said dither modulation frequency.

29. The method as claimed in claim 28, wherein said tunable wavelength selective device includes a bandpass filter having a tunable passband center wavelength, wherein said tunable passband center wavelength is tuned to a center wavelength of said electromagnetic signal so that electromagnetic signal power is maximally transmitted through said bandpass filter in said system.

30. A servo-control circuit for tuning a laser signal generator providing an optical signal at a specified wavelength in an optical system, said optical system including a bandpass filter means for receiving and transmitting optical signals in said optical system at a desired wavelength, said servo-control system comprising:
means for applying a bias signal to said laser signal generator for tuning said optical signal to a specific wavelength;
means for applying a dither modulation to said bias signal to produce a dither modulated optical signal, said dither modulated optic signal being input to said bandpass filter means;
detector means for receiving said dither modulated optical signal output from said bandpass filter means and convening said received optical signal into an electrical feedback signal; and,
means for generating an error signal comprising a vector cross product of said converted feedback signal and a dither modulation signal, said error signal responsively modifying the bias signal until a frequency characteristic of said converted feedback signal is two times a dither modulation frequency, whereby at such time said wavelength of said optical signal exactly matches the desired wavelength of said bandpass filter means.

31. The servo-control circuit for tuning a laser signal generator as claimed in claim 30, wherein said bandpass filter device comprises multiple bandpass filters in series, said multiple bandpass filters exhibiting a composite filter response representing a passband center wavelength, wherein said laser signal is tuned to said passband center wavelength so that optical signal power is maximally transmitted through said series of multiple bandpass filters in said optical system.

32. The servo-control circuit for tuning a laser signal generator as claimed in claim 30, wherein said detector includes a photodetector device.

33. The servo-control circuit for tuning a laser signal generator as claimed in claim 32, wherein said photodetector device is a p-i-n diode.

34. The servo-control circuit for tuning a laser signal generator as claimed in claim 30, wherein said means for generating an error signal includes:
a mixer capable of combining said converted feedback signal with said dither modulation signal and generating a vector cross-product signal having components representing a sum and difference at dither frequencies;
a low-pass filter device for filtering said output cross-product signal; and
an integrator circuit for averaging said output cross-product signal to generate said error signal, whereby said error signal is positive or negative depending on whether a center wavelength of said optical signal is respectively less than or greater than said desired wavelength of said bandpass filter means.

35. The servo-control circuit for tuning a laser signal generator as claimed in claim 30, further including wavelength shifter device for receiving said error signal and varying said error signal in an amount to accordingly adjust said bias signal applied to said laser diode to offset the laser signal center wavelength in a predetermined manner.

36. The servo-control circuit for tuning a laser signal generator as claimed in claim 30, further including thermocouple device for receiving said error signal and modifying a temperature of said laser diode for adjusting a frequency of said laser signal in an appropriate direction according to said error signal.

37. A servo-control circuit for tuning a tunable wavelength selective means for receiving and transmitting optical signals of a desired wavelength in an optical system, said servo-control system comprising:
   means for applying a dither modulation signal at a dither modulation frequency to said tunable wavelength selective means, said tunable wavelength selective means further receiving said optical signal having a center wavelength and generating a dither modulated optical signal for output thereof;
   means for converting a portion of said dither modulated optical signal to an electric feedback signal;
   means for generating an error signal comprising a vector cross product of said feedback signal and a dither modulation signal; and
   means for adjusting a passband center wavelength of said tunable wavelength selective means according to said error signal until a frequency characteristic of said converted feedback signal is two times said dither modulation frequency, whereby at such time said desired wavelength of said tunable wavelength selective means exactly matches a wavelength of said input optical signal.

38. A method for tuning a laser signal generator providing an optical signal at a specified wavelength in an optical system, said optical system including a bandpass filter means for receiving and transmitting optical signals in said optical system at a desired wavelength, said method comprising the steps of:
   a) applying a bias signal to said laser signal generator for tuning said optical signal to a specific wavelength,
   b) applying a dither modulation to said bias signal to produce a dither modulated optical signal, said dither modulated optic signal being input to said bandpass filter means;
   c) converting said received optical signal into an electrical feedback signal; and,
   d) generating an error signal comprising a vector cross product of said converted feedback signal and a dither modulation signal, said error signal responsively modifying the bias signal until a frequency characteristic of said converted feedback signal is two times said dither modulation frequency, whereby at such time said wavelength of said optical signal exactly matches the desired wavelength of said bandpass filter means.

39. The method for tuning a laser signal generator as claimed in claim 38, wherein said generating step d) includes the steps of:
   combining said converted feedback signal with said dither modulation signal and generating a vector cross-product signal having components representing a sum and difference at dither frequencies,
   filtering said output cross-product signal; and
   averaging said output cross-product signal to generate said error signal, said error signal being positive or negative depending on whether a center wavelength of said optical signal is respectively less than or greater than said desired wavelength of said wavelength selective device.

40. The method for tuning a laser signal generator as claimed in claim 38, further including the step of: providing wavelength shifter device for receiving said error signal and varying said error signal in an amount to accordingly adjust said bias signal applied to said laser diode to offset the laser signal center wavelength in a predetermined manner.

41. The method for tuning a laser signal generator as claimed in claim 38, further including the step of: providing thermocouple device for receiving said error signal and modifying a temperature of said laser diode for adjusting a frequency of said laser signal in an appropriate direction according to said error signal.

42. The wavelength-locked loop servo-control circuit as claimed in claim 1, wherein said error signal is a continuous bi-polar error signal function capable of being adjusted positive or negative for driving said center wavelength of said electromagnetic signal respectively less than or greater than said center wavelength of said wavelength selective means according to a desired application.

43. The wavelength-locked loop servo-control circuit as claimed in claim 18, wherein said error signal is a continuous bi-polar error signal function capable of being adjusted positive or negative for driving said center wavelength of said tunable wavelength selective means respectively less than or greater than said center wavelength of said electromagnetic signal according to a desired application.

44. The method as claimed in claim 21, wherein said error signal is a continuous bi-polar error signal function capable of being adjusted positive or negative for driving said center wavelength of said electromagnetic signal respectively less than or greater than said center wavelength of said wavelength selective means according to a desired application.

45. The method as claimed in claim 28, wherein said error signal is a continuous bi-polar error signal function capable of being adjusted positive or negative for driving said center wavelength of said tunable wavelength selective means respectively less than or greater than said center wavelength of said electromagnetic signal according to a desired application.

46. The servo-control circuit for tuning a laser signal generator as claimed in claim 30, wherein said error signal is a continuous bi-polar error signal function capable of being adjusted positive or negative for modifying the bias signal to obtain an optical signal having a wavelength respectively less than or greater than said desired wavelength of said bandpass filter means according to a desired application.

47. The servo-control circuit for tuning a tunable wavelength selective device as claimed in claim 37, wherein said error signal is a continuous bi-polar error signal function capable of being adjusted positive or negative for modifying the passband wavelength respectively less than or greater than said center wavelength of said tunable wavelength selective means according to a desired application.

48. The method for tuning a laser signal generator as claimed in claim 38, wherein said error signal is a continuous bi-polar error signal function capable of being adjusted positive or negative for modifying the bias signal to obtain an optical signal having a wavelength respectively less than or greater than said desired wavelength of said bandpass filter means according to a desired application.

* * * * *